United States Patent
Sundström et al.

(10) Patent No.: US 7,138,861 B2
(45) Date of Patent: Nov. 21, 2006

(54) LOAD MISMATCH ADAPTATION IN COUPLER-BASED AMPLIFIERS

(75) Inventors: Lars Sundström, Lund (SE); Per-Olof Brandt, Lomma (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 3 days.

(21) Appl. No.: 11/025,497

(22) Filed: Dec. 29, 2004

(65) Prior Publication Data
US 2006/0139092 A1    Jun. 29, 2006

(51) Int. Cl.
*H03F 3/68* (2006.01)

(52) U.S. Cl. .............. 330/124 R; 330/127; 330/53; 330/302

(58) Field of Classification Search ............ 330/124 R, 330/53, 127, 302
See application file for complete search history.

(56) References Cited

U.S. PATENT DOCUMENTS

| | | | |
|---|---|---|---|
| 3,911,372 A * | 10/1975 | Seidel | 330/286 |
| 4,547,746 A * | 10/1985 | Erickson et al. | 330/298 |
| 6,133,792 A | 10/2000 | Hansson | |
| 6,552,634 B1 * | 4/2003 | Raab | 333/216 |
| 6,703,080 B1 * | 3/2004 | Reyzelman et al. | 427/445 |
| 6,845,126 B1 * | 1/2005 | Dent et al. | 375/219 |
| 2004/0082354 A1 | 4/2004 | Cohen | |

FOREIGN PATENT DOCUMENTS

| | | |
|---|---|---|
| EP | 1521360 A | 4/2005 |
| WO | 2004/114516 A | 12/2004 |

OTHER PUBLICATIONS

ISA/EPO; International Search Report; Apr. 6, 2006; pp. 1-5; EPO; Rijswijk, NL.
IPEA/EPO; Written Opinion; Apr. 6, 2006; pp. 1-11; EPO; Rijswijk, NL.

* cited by examiner

*Primary Examiner*—Patricia Nguyen
(74) *Attorney, Agent, or Firm*—Potomac Patent Group PLLC

(57) ABSTRACT

Coupler-based amplifiers provide a measure of load mismatch based on the difference between the two output signal amplitudes from the amplifiers. This measure can be used to control variable matching networks (VMNs) or amplifier supply voltages to maintain constant distortion levels and high power transfer/efficiency and even to control output power. Load mismatch is measured by comparing the amplifier device output amplitudes and adjusting the circuit based on the comparison to counteract undesired behavior, such as increasing distortion levels.

20 Claims, 8 Drawing Sheets

LOAD MISMATCH ADAPTATION IN COUPLER-BASED AMPLIFIERS

BACKGROUND

This invention relates to electronic amplifiers and more particularly to coupler-based amplifiers.

FIG. 1 is a circuit diagram of a conventional coupler-based amplifier 100 that includes two amplifier devices 102, 104. This circuit architecture is typically used when the output power to be delivered to the load $Z_L$ exceeds the capability of a single amplifier device. In the figure, the source is indicated as a voltage source and a series impedance $Z_S$. When the 3-dB couplers 106, 108 are of quadrature type, e.g., field-coupled lines with an electrical length of one-quarter wavelength, mismatches between the individual amplifier devices 102, 104 and the couplers do not appear at the source and load connections. It will be noted that as shown, the secondary connections of the couplers are terminated in the characteristic impedance $Z_O$. This architecture also provides some protection against amplifier device failure in that if one device breaks down, the amplifier still works but with reduced output power.

Coupler-based amplifiers are known in the art. U.S. Pat. No. 4,656,434 to Selin discloses a coupler-based power amplifier where load mismatch is compensated by feedback from the output coupler to the input coupler. U.S. Pat. No. 6,297,696 to Abdollahian et al. discloses a coupler-based power amplifier with dynamic load impedance matching based on measured reflected output power. U.S. Pat. No. 6,515,541 to Cheng et al. discloses a coupler-based power amplifier with impedance modification circuits coupled to the isolated ports of the couplers, in which the impedances are modified when one amplifier is turned off. U.S. Patent Application Publication No. 2002/0186079 to Kobayashi discloses a balanced amplifier with a coupler connected to the inputs of the amplifiers and matching networks connected to the outputs of the amplifiers.

A problem with conventional amplifiers such as those described above is that when the amplifier is connected to a varying load impedance $Z_L$, the impedances $Z_{L1}$, $Z_{L2}$ "seen" by each amplifier device diverge from the nominal value of $Z_L$, e.g., 50 Ω. If the load is purely resistive, the impedances diverge in opposite directions with respect to both the real and imaginary parts. One amplifier device "sees" an impedance that is approximately equal to the load impedance (i.e., $Z_{L1} \approx Z_L$), and the other amplifier device "sees" the impedance of a $\lambda/4$-transformed load impedance (i.e., $Z_{L2} \approx Z_O^2/Z_L$). This in turn leads to diverging signal amplitudes $V_{out1}$, $V_{out2}$, respectively, from the amplifier devices 102, 104.

SUMMARY

Disadvantages and problems in previous coupler-based amplifiers are addressed by this invention, which in one aspect provides a coupler-based amplifier that includes a first branch amplifier device that produces a first branch output signal; a second branch amplifier device that produces a second branch output signal; a coupler connected to the first and second branch amplifier devices such that the first and second branch signals are combined for delivery to a load; a first envelope detector that produces a first envelope signal based on the first branch output signal; a second envelope detector that produces a second envelope signal based on the second branch output signal; and a differential device that forms a control signal corresponding to a difference between the first envelope signal and the second envelope signal. The control signal is related to a reflection coefficient of the load. In another aspect of the invention, such a coupler-based amplifier further includes a variable matching network (VMN) that is controlled by the control signal such that impedance transformation between the load and an output port of the coupler is controlled.

In another aspect of this invention, a method of controlling a coupler-based amplifier that has at least two branch amplifier devices and a coupler that deliver a signal to a load includes the steps of generating a control signal based on a difference between respective output signals generated by two branch amplifier devices; and controlling the two branch amplifier devices based on the control signal. The control signal is related to a reflection coefficient of the load. The measuring step may includes the steps of detecting envelopes of the output signals; subtracting one detected envelope from the other detected envelope, thereby forming a difference signal; and comparing the difference signal to a reference, thereby forming the control signal.

In yet another aspect of this invention, a coupler-based amplifier includes a first branch amplifier device that produces a first branch output signal; a second branch amplifier device that produces a second branch output signal; a coupler connected to the first and second branch amplifier devices such that the first and second branch signals are combined for delivery to a load; a first envelope detector that produces a first envelope signal based on the first branch output signal; and a second envelope detector that produces a second envelope signal based on the second branch output signal. The amplifier further includes a first adjustable power supply for the first branch amplifier; a second adjustable power supply for the second branch amplifier; a first differential device that forms a first control signal corresponding to a difference between the first envelope signal and an output level of the first adjustable power supply; and a second differential device that forms a second control signal corresponding to a difference between the second envelope signal and an output level of the second adjustable power supply. The first and second control signals are related to a reflection coefficient of the load. The first control signal controls the output level of the first adjustable power supply and the second control signal controls the output level of the second adjustable power supply.

BRIEF DESCRIPTION OF THE DRAWINGS

The various objects, features, and advantages of this invention will become apparent from reading this description in conjunction with the drawings, in which like elements are identified by like reference characters and.

DETAILED DESCRIPTION

This invention exploits a property of a coupler-based amplifier that provides a measure of load mismatch based on the difference between two output signal amplitudes from two branch signal amplifiers. This measure can be used to control a variable matching network (VMN) or individual supply voltages for each amplifier to maintain constant distortion levels and high power transfer/efficiency. The invention described in this application exploits this property to measure load mismatch by comparing the amplifier device output amplitudes and adjusting the circuit based on the comparison to counteract undesired behavior, such as increasing distortion levels.

Figure 2:
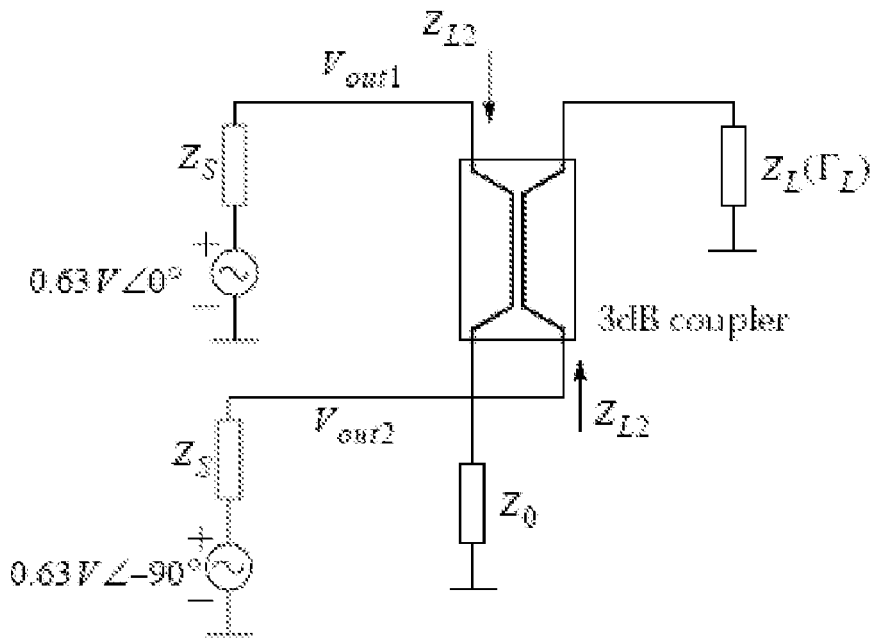
FIG. 2 is illustrates a coupler in a configuration with two power sources.

FIG. 2 illustrates a coupler in a configuration with two power sources, and this configuration can be used to model the output of the two amplifiers. In the diagram, two power sources (0.63-volt sources with series impedances $Z_S$) drive an ideal field-coupled-line 3-dB coupler with an electrical length of one-quarter wavelength. The power sources are in quadrature as indicated by the respective phase angles to direct all power to the output load $Z_L$ under nominal operating conditions. The sources "see" respective impedances $Z_{L1}$, $Z_{L2}$. An AC-analysis, which may be conveniently carried out by a system such as HP ADS, can be used to find the branch signal amplitude difference $|V_{out1}|-|V_{out2}|$ and the output power when the output load impedance $Z_L$ is varied.

Figure 3:
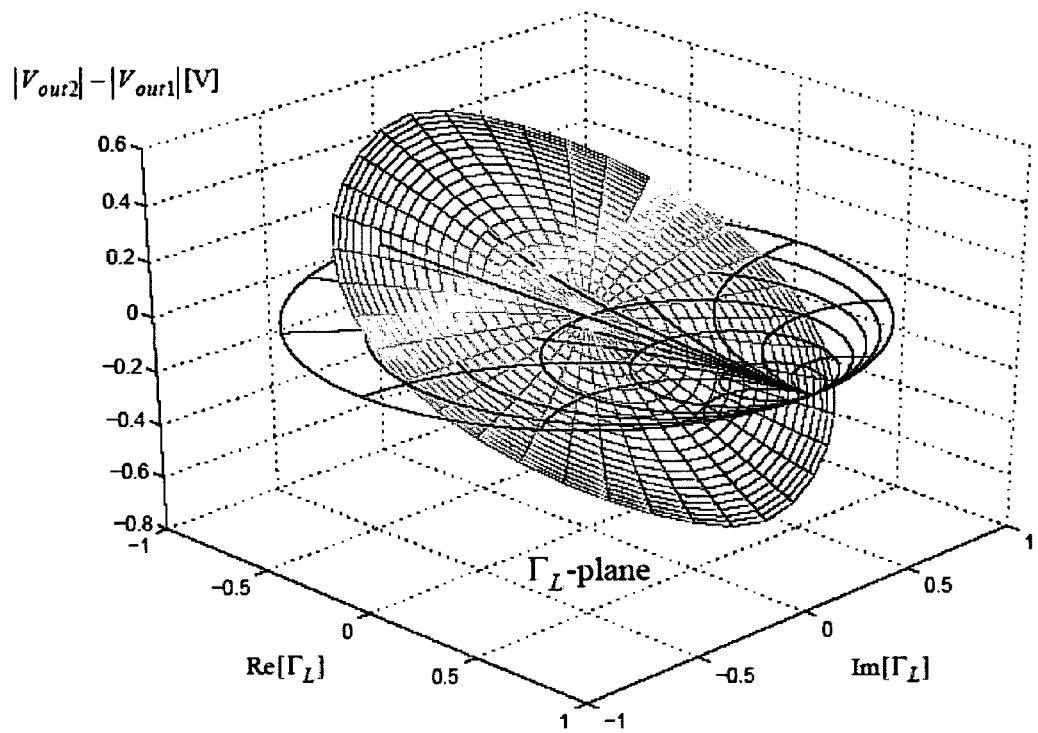
FIG. 3 is a plot of simulated branch signal amplitude difference as a function of output load for the conventional coupler-based amplifier.
Figure 4:
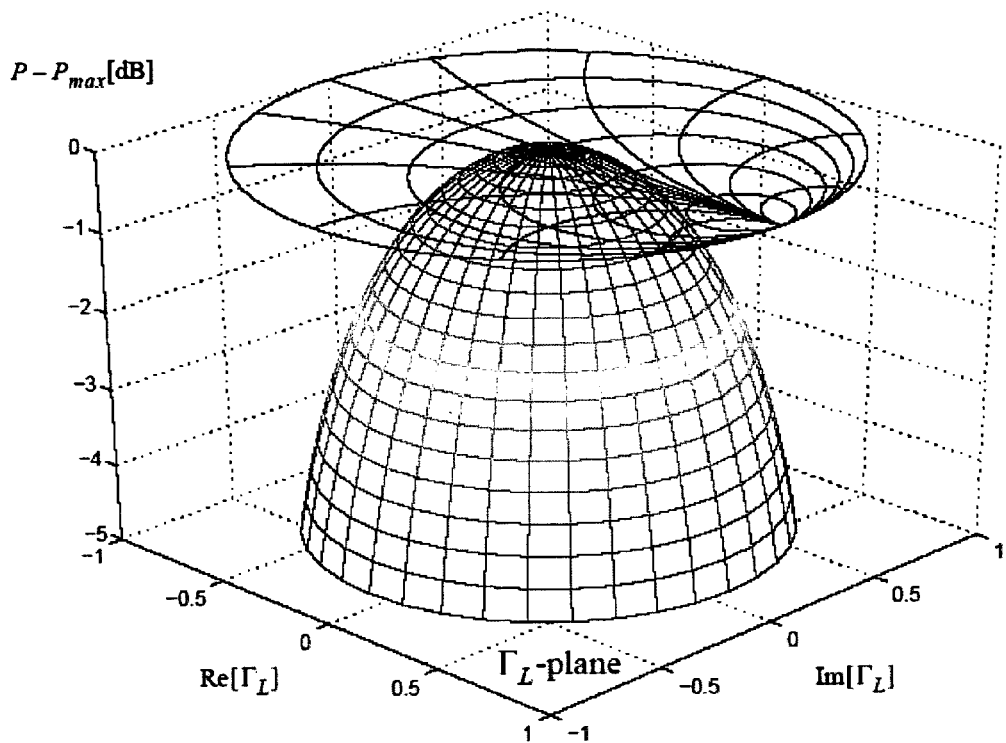
FIG. 4 is a plot of simulated normalized power at the load as a function of output load for the conventional coupler-based amplifier.

The results of such an AC-analysis are presented in FIGS. 3 and 4, which show the signal amplitude difference as a function of $\Gamma_L$ ($\Gamma_L$-plane or Smith-chart plane), where $\Gamma_L$ is the reflection coefficient for the load of the coupler-based configuration and the nominal impedance is 50 Ω. FIG. 3 shows the branch signal amplitude difference as a function of output load impedance $Z_L$, and FIG. 4 shows the normalized power at the load P–$P_{MAX}$ as a function of output load impedance. FIG. 3 shows that the branch signal amplitude difference is directly related to the real part of the load reflection coefficient $\Gamma_L$.

Whether a more realistic amplifier circuit, in particular a silicon-germanium (SiGe) power amplifier output stage operating at 1.95 GHz, shows the same behavior as the simplified circuit diagram of FIG. 2 has been investigated. The SiGe power amplifier was not conjugately matched between the coupler and each amplifier device. Instead, the impedance levels were selected to optimize output power for a given supply voltage. Thus, there was a mismatch, which could be expected to affect the behavior to some extent.

Figure 5:
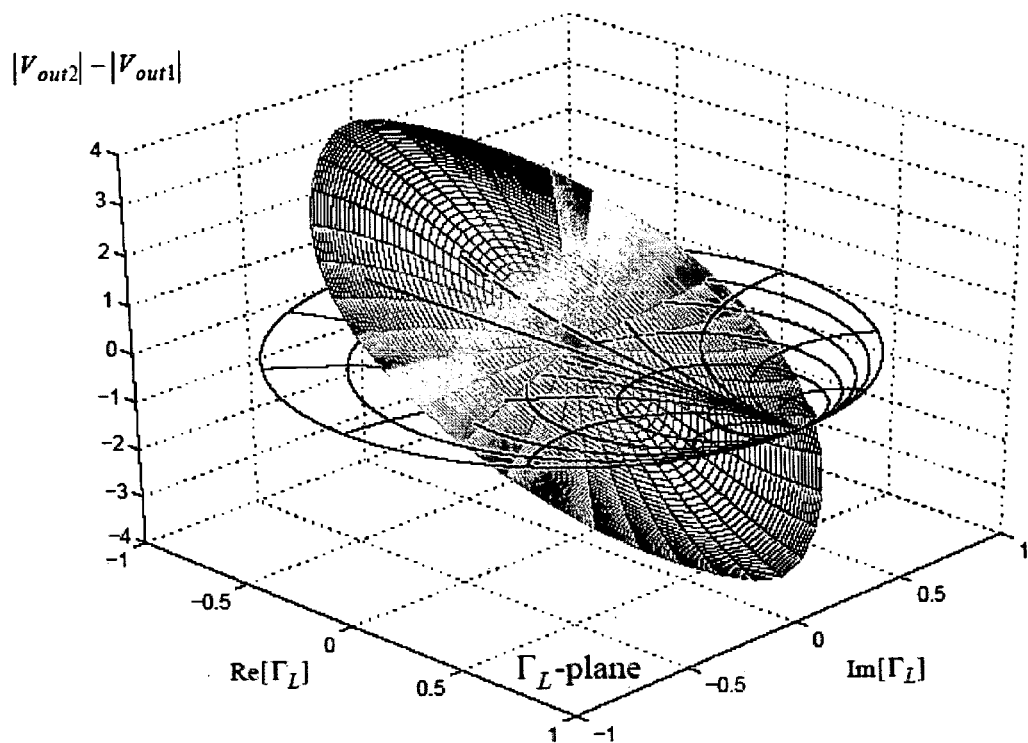
FIG. 5 is a plot of branch signal amplitude difference as a function of output load for the conventional coupler-based amplifier.
Figure 6:
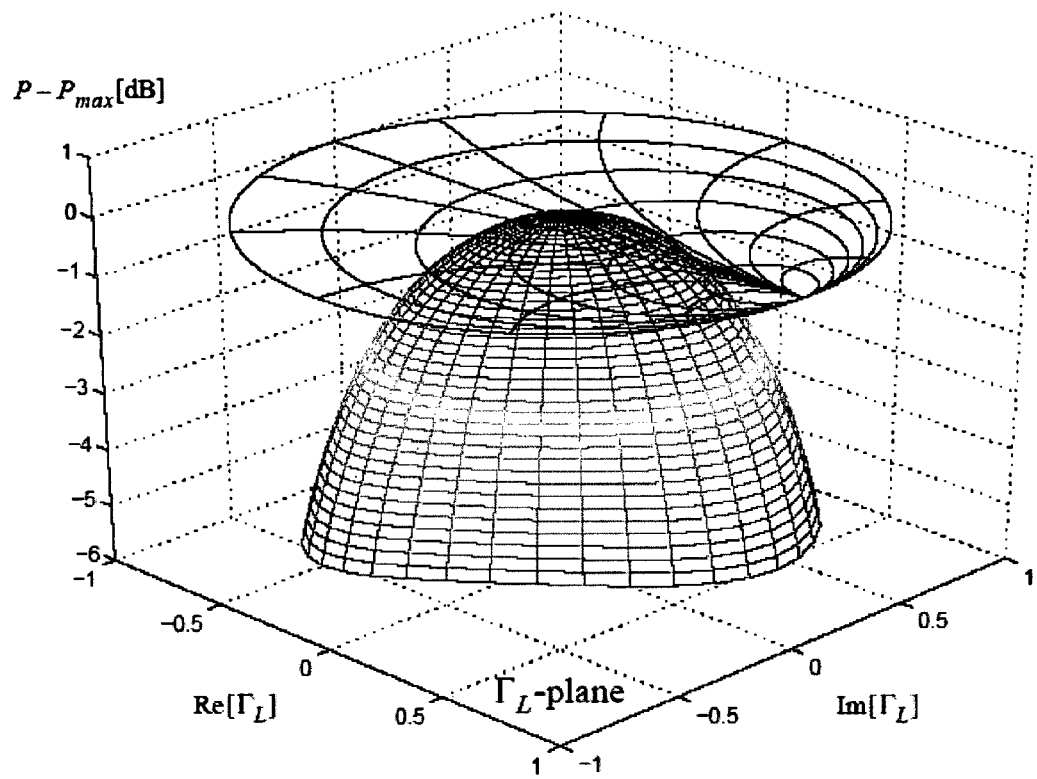
FIG. 6 is a plot of normalized power at the load as a function of output load for the conventional coupler-based amplifier.

FIGS. 5 and 6 show simulated results on the SiGe circuit for the functional relationships that were simulated in FIGS. 3 and 4. As is readily seen by comparing FIGS. 3 and 5, and FIGS. 4 and 6, approximately the same characteristics are obtained, although the plot in FIG. 5 of $|V_{out1}|-|V_{out2}|$ is slightly rotated in the $\Gamma_L$-plane due to imperfections of the actual coupler. Also, the normalized power plot in FIG. 6 is somewhat distorted. Nevertheless, it will be recognized that the branch signal amplitude difference can be used as a coarse but useful measure of the load mismatch.

Although the branch signal amplitude difference is a measure of the load mismatch, it is a single (real-valued) quantity. Thus, it does not provide complete information on where on a Smith-chart one can find the load. In fact, the branch signal amplitude difference is related almost solely to the real part of $\Gamma_{Lx}$, which is the reflection coefficient for the load as seen by one amplifier device, e.g., the input impedance of one of the input ports of the coupler. Nevertheless, if the goal is to provide operating conditions for the amplifier devices 102, 104 such that the signal level as well as the distortion level is kept approximately constant, then it is sufficient to rely on the real part of $\Gamma_{Lx}$.

Figure 7:
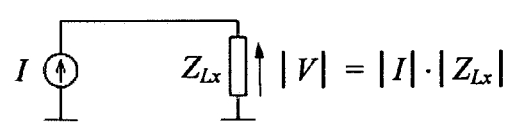
FIG. 7 depicts a model of an amplifier device.
Figure 8:
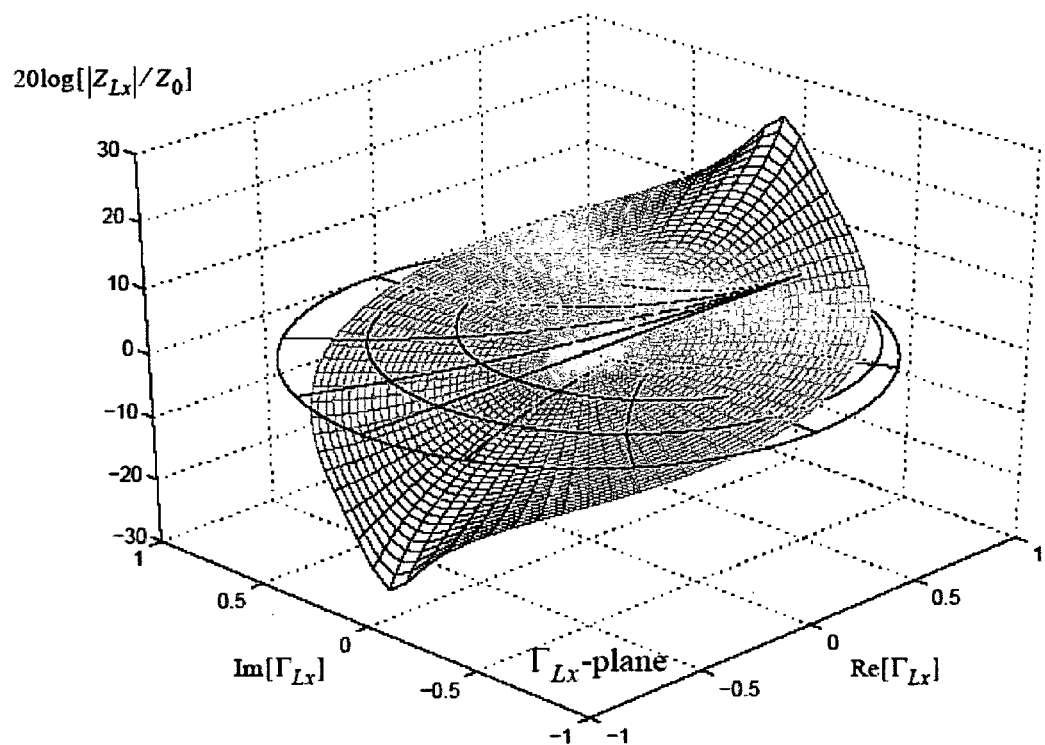
FIG. 8 is a plot of simulated normalized absolute impedance as a function of corresponding reflection coefficient for the model of FIG. 7.

The rationale for this can be seen by considering the simple model of one amplifier device that is shown in FIG. 7. The output of the amplifier is modeled as a current source I that drives a load impedance $Z_{Lx}$. With everything else kept constant, the absolute voltage signal level |V| across the load is proportional to the absolute value of the impedance $|Z_{Lx}|$, with the constant of proportionality being simply the absolute value of the current |I|. This will be recognized as an expression of Ohm's law. The relationship between $|Z_{Lx}|$, which is the load seen by one amplifier device, and the reflection coefficient $\Gamma_{Lx}$ for the simple example of FIG. 7 is depicted in FIG. 8, which shows the normalized absolute impedance $Z_{Lx}/Z_O$ as a function of the corresponding reflection coefficient $\Gamma_{Lx}$. From FIG. 8, it can be seen that the imaginary part of $\Gamma_{Lx}$ has only a limited effect on $|Z_{Lx}|$ and therefore also only a limited effect on the corresponding signal level.

Figure 9:
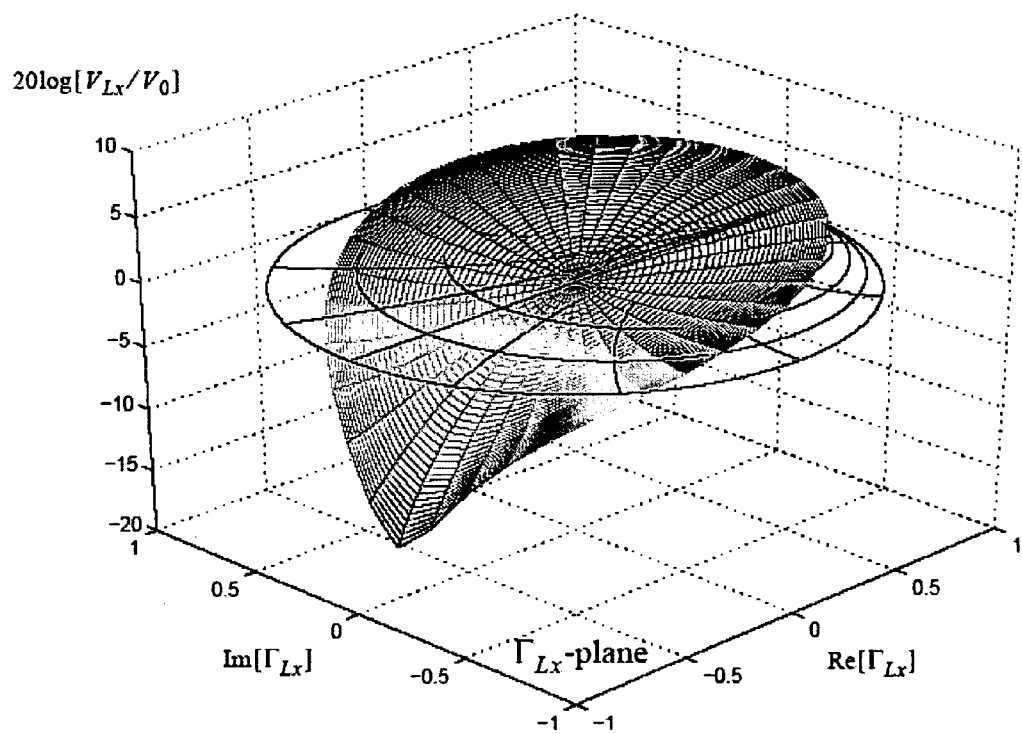
FIG. 9 is a plot of measured normalized output level of an amplifier device as a function of the load reflection coefficient.

In practice, each amplifier device has an output impedance itself and generally the characteristics of the output impedance are nonlinear and complicated. For the SiGe power amplifier device simulated above, substantially the same behavior as shown FIG. 9 was observed, where the normalized output level $V_{Lx}/V_O$ of one SiGe amplifier device (i.e., the normalized absolute output voltage using nominal load impedance) is shown as a function of the reflection coefficient $\Gamma_{Lx}$. It will be noted from FIG. 9 that for increasing impedance, the output levels out somewhat due to the output impedance of the amplifier stage.

Figure 1:
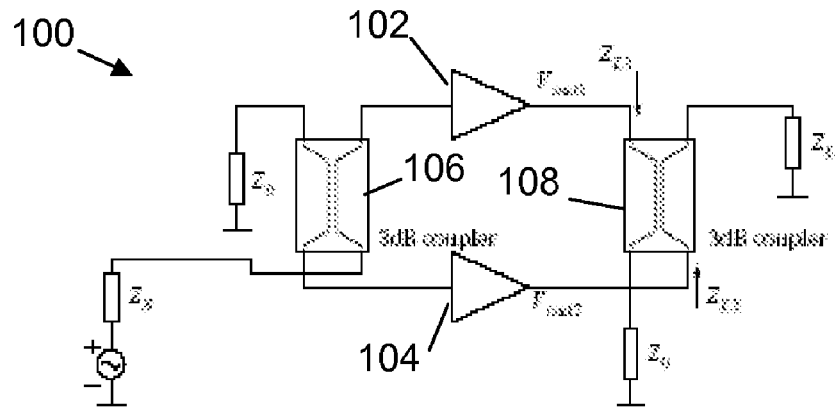
FIG. 1 is a circuit diagram of a conventional coupler-based amplifier.
Figure 10:
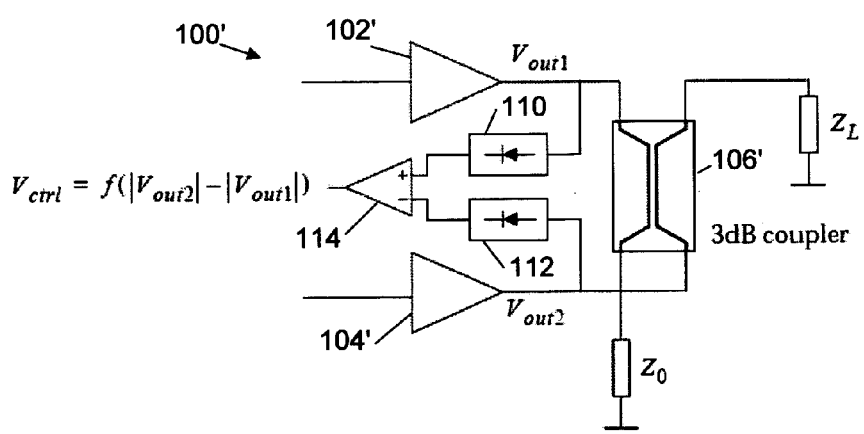
FIG. 10 is a diagram of an amplifier that measures signal amplitude differences where the signal amplitudes from each amplifier device are detected by envelope detectors.

FIG. 10 is a diagram of an amplifier 100' that measures branch signal amplitude differences where the branch signal amplitudes from each amplifier device 102', 104' are detected by detectors 110, 112. As in the arrangement of FIG. 1, the amplifier devices are connected to the load impedance $Z_L$ through a 3-dB coupler 106'. Attenuators, filters, and other signal conditioning components may precede the detectors 110, 112, if desired. The detected amplitudes are subtracted, for example by a suitable differential amplifier 114, to obtain a control signal $V_{CTRL}$ that is roughly proportional to (or at least a monotonic function of) the difference between the actual branch signal amplitudes $V_{out1}$, $V_{out2}$.

The detectors 110, 112 can be envelope detectors using diodes and resistor-capacitor (R-C) networks, such as Schottky diodes, or other fast devices having low "knee" voltages suitable for high-frequency operation. It will be appreciated, however, that other devices that produce envelope-related measures can also be used as long as the two detectors can be suitably matched. It is preferable for simplicity that the envelope-related measure is a monotonic function of the envelope of the signal being detected. Thus, power detectors (e.g., linear power or log power) can be used instead of diode envelope detectors. For example, a Gilbert-cell multiplier can be used to square the output signal from the amplifier, with the squared result being low-pass filtered. The output of the filter will be proportional to the power of the envelope.

The control voltage $V_{CTRL}$ can be used to control the amplifier to optimize performance for varying load conditions. Two ways to control the behavior of a coupler-based amplifier based on the amplitude difference control signal are described below.

Figure 11:
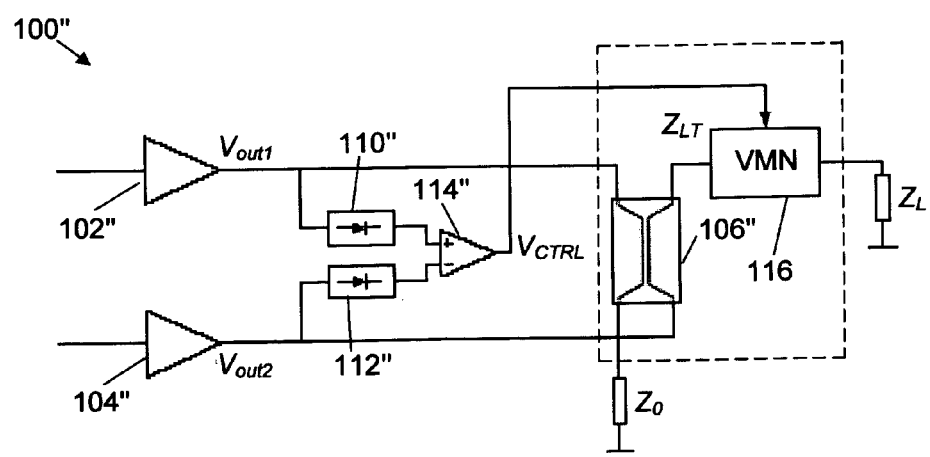
FIG. 11 is a diagram of a coupler-based amplifier having envelope detectors and a variable matching network controlled by an amplitude difference signal.

With a variable matching network (VMN), such as that described in U.S. Patent Application Publication No. US 2002/0101907 A1 by Dent et al., which is incorporated here by reference, between the output port of the coupler and the load, the impedance seen by each amplifier device can be controlled such that signal level and distortion products become substantially constant with changing output load impedance. Power transfer can also be improved. Such an arrangement is depicted in FIG. 11, which is a diagram of a coupler-based amplifier 100" having branch amplifiers 102", 104", a 3-dB coupler 106", envelope detectors 110", 112", and a differencing device 114" as in the arrangement of FIG. 10. The arrangement of FIG. 11 also has a VMN 116 that is controlled by the difference signal $V_{CTRL}$ produced by the differencer 114". Indeed, it will be appreciated that the VMN can need only the sign of the difference signal. The impedance $Z_{LT}$ is the load impedance $Z_L$ transformed by the VMN 116 that is seen by the coupler 106". The kind of arrangement depicted in FIG. 11 achieves a well-defined impedance for the amplifier.

A suitable VMN 116 can be implemented in several ways, for example by using ordinary matching networks that include lumped and distributed circuit elements (discrete and/or integrated), of which one or more are variable. The variable circuit elements may be micro-electro-mechanical systems (MEMs), varactor diodes, switches, etc. These variable circuit elements are controlled directly or indirectly by the control signal $V_{CTRL}$ discussed above using either a suitable time-continuous function or a digital (possibly microprocessor-based) function or algorithm to continuously or continually optimize the amplifier performance with respect to distortion and power transfer.

Figure 12:
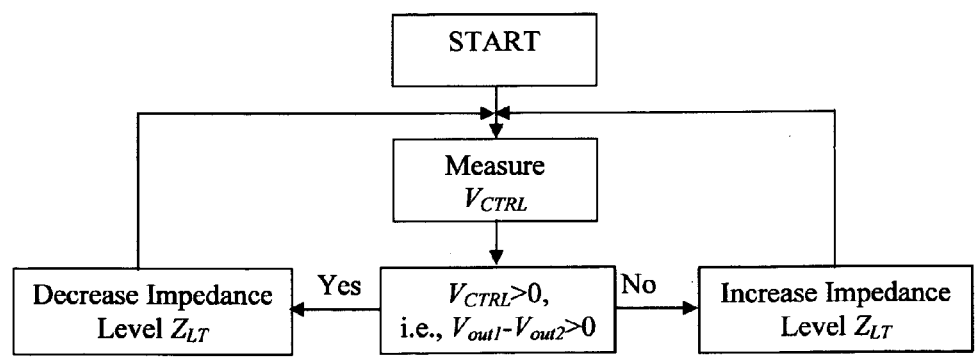
FIG. 12 is a flow chart of an "algorithmic" amplifier optimization method.

FIG. 12 is a flow chart of one simple example of a coupler-based amplifier optimization method that is suitable for circuit configurations such as that depicted in FIG. 11, in which one branch amplifier device (e.g., the upper-branch device 102") is assumed to see an impedance that increases with increasing load impedance $Z_L$ while the other branch amplifier device (e.g., the lower-branch device 104") sees a correspondingly decreasing load impedance. The method controls the VMN 116 based on the difference signal $V_{CTRL}$, which is measured (step 202). If $V_{CTRL}$ is determined to be less than zero or some threshold value (step 204), the VMN 116 is adjusted such that the impedance $Z_{LT}$ decreases (step 206). Correspondingly, if $V_{CTRL}$ is determined to be greater than zero or some threshold value (step 204), the VMN 116 is adjusted such that the impedance $Z_{LT}$ increases (step 208). It will be understood that the details of this technique of increasing or decreasing the impedance depend on the details of the matching networks.

Figure 13:
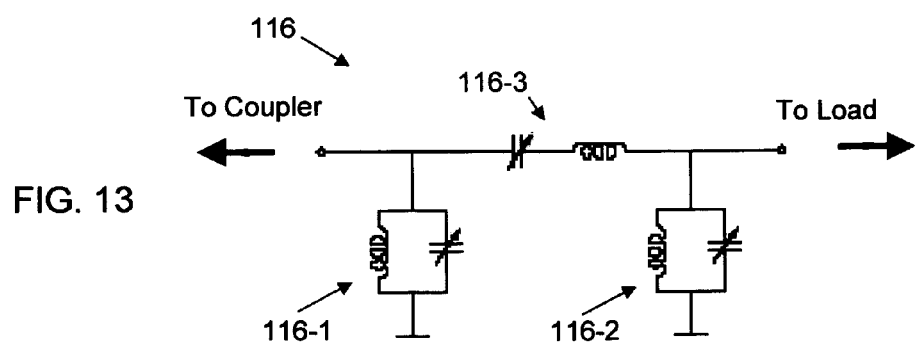
FIG. 13 depicts an exemplary variable matching network that is based on fixed inductors and variable capacitors.

As noted above, a VMN can be implemented in many ways, and US 2002/0101907 A1 cited above describes example circuitry. FIG. 13 depicts an example of a VMN that is based on fixed inductors and variable capacitors. In this example, the VMN 116 has a three resonant sub-circuits that include two parallel circuits 116-1, 116-2 and one series circuit 116-3. If the load would present the nominal desired impedance to the coupler, the capacitors could be tuned to make the VMN invisible by ensuring that each sub-circuit is in resonance at the operating frequency. Any change of a capacitor in a sub-circuit will make that sub-circuit effectively inductive or capacitive. Thus, a high impedance can be transformed to a lower impedance and vice versa (or at least moved towards $\text{Re}[\Gamma_L]=0$, which is the most important aspect with respect to distortion as discussed above) according to well established methods for the design of matching networks.

Figure 14:
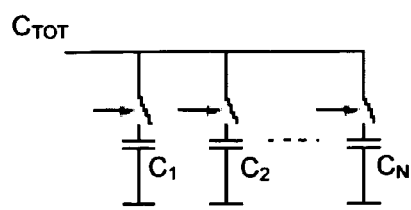
FIG. 14 depicts an exemplary set of capacitors and respective switches that produce a variable total capacitance.

It will be understood that the circuit depicted in FIG. 13 is only one example of many that are available as VMNs, and both less and more complex circuits can be derived depending on the requirements of bandwidth, cost, degrees of freedom, accuracy and resolution of the matching network, etc. Variable circuit elements like the variable capacitors in FIG. 13 can be implemented in many ways, e.g., with varicap diodes that provide a continuous range of capacitive values. Instead of or in addition to such continuously variable capacitors, a set or sets of fixed capacitors and/or inductors and switches can provide a range of discrete values. FIG. 14 shows one example of a set of N capacitors $C_1, C_2, \ldots, C_N$ and respective switches that, depending on the particular closed switches and the values of $C_1, C_2, \ldots, C_N$, produce a variable total capacitance $C_{TOT}$ that can be used in the VMN 116.

It will also be recognized that the coupler between the amplifiers and the load may itself be a reactive element that includes one or more variable reactive components, including capacitors, inductors, transformers, and transmission lines. Consequently, the VMN and coupler functionality effectively can be implemented in a single circuit block, as indicated in FIG. 11 by the dashed lines around the coupler 106" and the VMN 116. In this way, the coupler may be tunable and responsive to the signal $V_{CTRL}$ such that impedance transformation between the load and an output port of the coupler is controlled.

Figure 15:
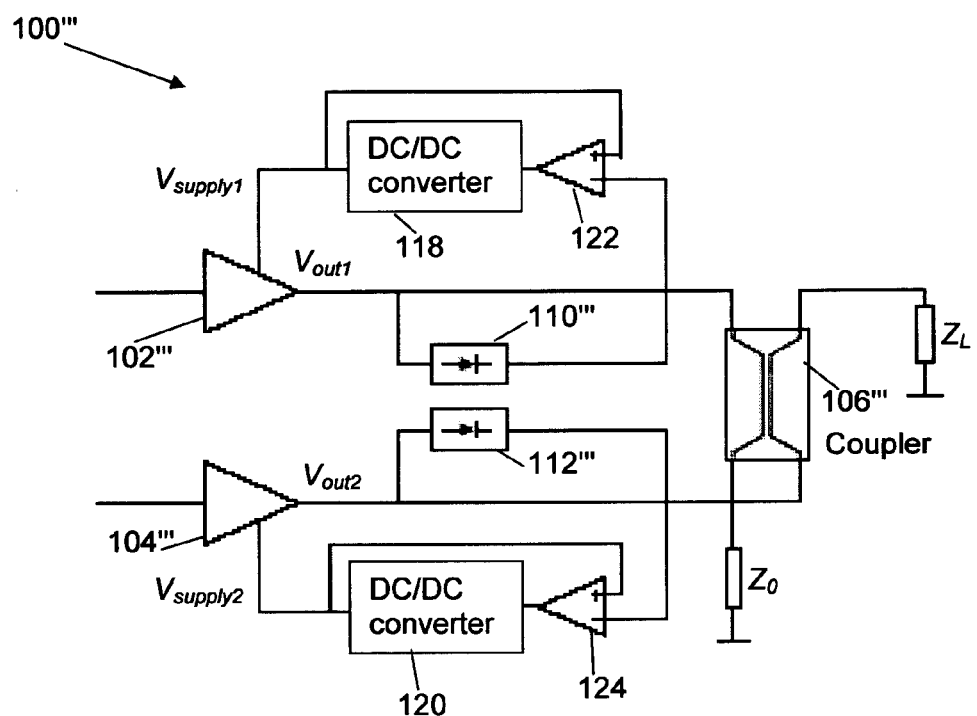
FIG. 15 is a diagram of a coupler-based amplifier having envelope detectors and adjustable power supplies.

Another way of controlling the behavior of a coupler-based amplifier involves providing separate power supplies for each branch amplifier device. If the supplies have sufficient headroom, the supplies can track the required signal range for each amplifier device to avoid increase of distortion when the gain increases. This is illustrated by FIG. 15, which is a diagram of a coupler-based amplifier 100''' having envelope detectors 110''', 112''', a 3-dB coupler 106''', and adjustable power supplies. Each of the branch amplifier devices 102''',104'''is connected to its own supply voltage, e.g., a respective DC/DC converter 118, 120. As shown, each DC/DC converter is controlled by the difference between a reference (e.g., the supply voltage output from the DC/DC converter) and the detected signal amplitude produced by an envelope detector. The difference control signals are generated by respective difference amplifiers 122, 124. A supply voltage level $V_{supply1}$, $V_{supply2}$ is controlled such that the difference between the detected signal and the reference is kept at a level such that each amplifier device is not saturated or generates undesired levels of distortion. In other words, when the impedance level of the load as seen by one amplifier device increases, then the device's output voltage $V_{out1}$, or $V_{out2}$ increases as well, and consequently the DC/DC converter is controlled to generate a higher supply voltage to enable the higher output voltage $V_{out}$.

A similar technique applied to a single amplifier is described in commonly owned U.S. Pat. No. 6,133,792 to Hansson. It will be understood that this power-supply-control technique does not compensate for the actual mismatch introduced by the varying load as does the VMN-based solution described above. Instead, the amplifier merely makes room for the varying signal range to avoid increased levels of distortion.

It will be understood that control of the power level of an output signal produced by an amplifier is often implemented by changing the amplitude of the amplifier's input signal. Nevertheless, it will be recognized that output power can also be controlled through the amplifiers energy supply. For example as described above, the power level can be lowered by decreasing the supply voltage(s) to a suitable level, e.g., a level where linearity or other requirements on the output signal are met. Therefore, besides using the detectors 110''', 112''' for load mismatch compensation, they can also be used for power control of the individual amplifier devices 102''', 104''' and the amplifier 100'''. Moreover, in a radio transmitter, the detectors can generate measures of transmitted power, and these can be used in a power control loop of a transmitter.

The VMNs described in US 2002/0101907 A1 cited above provide a general solution for complete characterization/measurement of the load impedance that can be used to adapt a VMN to maintain power transfer, efficiency and constant level of distortion. Albeit powerful, this solution is complicated. The techniques described here rely on a coupler-based power amplifier configuration for which a simpler envelope detection technique can be used to measure the part of load mismatch (the real part of the reflection coefficient for the load) that results in variations of amplifier output signal levels and therefore also indirectly distortion. Another advantage of the techniques described in this application is that it is not necessary to rely on the actual value of output signal level difference. The sign of this quantity alone is sufficient to control a VMN.

It will be appreciated that procedures described above are carried out repetitively as necessary and that to facilitate understanding, many aspects of this invention are described in terms of sequences of actions that can be performed by, for example, elements of a programmable computer system. Moreover, in some cases it is possible to carry out the procedures in an analog, time-continuous way, with the detected envelope difference being used to control, directly or indirectly, the elements of a VMN. It will be recognized that various actions could be performed by specialized circuits (e.g., discrete logic gates interconnected to perform a specialized function or application-specific integrated circuits), by program instructions executed by one or more processors, or by a combination of both.

Thus, the invention may be embodied in many different forms, not all of which are described above, and all such forms are contemplated to be within the scope of the invention. For each of the various aspects of the invention, any such form may be referred to as "logic configured to" perform a described action, or alternatively as "logic that" performs a described action.

It is emphasized that the terms "comprises" and "comprising", when used in this application, specify the presence of stated features, integers, steps, or components and do not preclude the presence or addition of one or more other features, integers, steps, components, or groups thereof.

The particular embodiments described above are merely illustrative and should not be considered restrictive in any way. The scope of the invention is determined by the following claims, and all variations and equivalents that fall within the range of the claims are intended to be embraced therein.

What is claimed is:

1. A coupler-based amplifier, comprising:
   a first branch amplifier device that produces a first branch output signal;
   a second branch amplifier device that produces a second branch output signal;
   a coupler connected to the first and second branch amplifier devices such that the first and second branch signals are combined for delivery to a load;
   a first envelope detector that produces a first envelope signal based on the first branch output signal;
   a second envelope detector that produces a second envelope signal based on the second branch output signal; and
   a differential device that forms a control signal corresponding to a difference between the first envelope signal and the second envelope signal, wherein the control signal is related to a reflection coefficient of the load.

2. The amplifier of claim 1, wherein the first and second envelope signals follow monotonic functions of the envelopes of the respective branch output signals.

3. The amplifier of claim 2, wherein at least one of the first and second envelope detectors includes a diode.

4. The amplifier of claim 3, wherein the diode is a Schottky diode.

5. The amplifier of claim 2, wherein the first and second envelope detectors are power detectors.

6. The amplifier of claim 1, further comprising a variable matching network (VMN) connected between the coupler and the load, wherein the VMN is controlled by the control signal such that impedance transformation between the load and an output port of the coupler is controlled.

7. The amplifier of claim 6, wherein the control signal is a sign of the difference.

8. The amplifier of claim 1, wherein the coupler is controlled by the control signal such that the load and the coupler are impedance-matched.

9. A method of controlling a coupler-based amplifier that has at least two branch amplifier devices and a coupler that deliver a signal to a load, comprising the steps of:
   generating a control signal based on a difference between respective output signals generated by two branch amplifier devices, wherein the control signal is related to a reflection coefficient of the load; and
   controlling the two branch amplifier devices based on the control signal.

10. The method of claim 9, wherein the measuring step includes the steps of:
    detecting envelopes of the output signals;
    subtracting one detected envelope from the other detected envelope, thereby forming a difference signal; and
    comparing the difference signal to a reference, thereby forming the control signal.

11. The method of claim 10, wherein the control signal is a sign of the difference signal.

12. The method of claim 10, wherein detecting envelopes of the output signals includes detecting powers of the output signals.

13. The method of claim 9, wherein the controlling step includes varying an impedance of a matching network.

14. The method of claim 13, wherein varying the impedance of a matching network includes varying at least one of a capacitance and an inductance.

15. The method of claim 9, wherein the controlling step includes varying at least one power supply level provided to at least one of the branch amplifier devices.

16. A coupler-based amplifier, comprising:
   a first branch amplifier device that produces a first branch output signal;
   a second branch amplifier device that produces a second branch output signal;
   a coupler connected to the first and second branch amplifier devices such that the first and second branch signals are combined for delivery to a load;
   a first envelope detector that produces a first envelope signal based on the first branch output signal;
   a second envelope detector that produces a second envelope signal based on the second branch output signal;
   a first adjustable power supply for the first branch amplifier;
   a second adjustable power supply for the second branch amplifier;
   a first differential device that forms a first control signal corresponding to a difference between the first envelope signal and an output level of the first adjustable power supply, wherein the first control signal is related to a reflection coefficient of the load; and
   a second differential device that forms a second control signal corresponding to a difference between the second envelope signal and an output level of the second adjustable power supply, wherein the second control signal is related to a reflection coefficient of the load;
   wherein the first control signal controls the output level of the first adjustable power supply and the second control signal controls the output level of the second adjustable power supply.

17. The amplifier of claim 16, wherein the first and second envelope signals follow monotonic functions of the envelopes of the respective branch output signals.

18. The amplifier of claim 17, wherein at least one of the first and second envelope detectors includes a diode.

19. The amplifier of claim 18, wherein the diode is a Schottky diode.

20. The amplifier of claim 17, wherein the first and second envelope detectors are power detectors.

* * * * *